United States Patent
Solayappan et al.

(10) Patent No.: US 7,064,374 B2
(45) Date of Patent: Jun. 20, 2006

(54) BARRIER LAYERS FOR PROTECTING METAL OXIDES FROM HYDROGEN DEGRADATION

(75) Inventors: Narayan Solayappan, Colorado Springs, CO (US); Jolanta Celinska, Colorado Springs, CO (US); Vikram Joshi, Colorado Springs, CO (US); Carlos A. Paz de Araujo, Colorado Springs, CO (US); Larry D. McMillan, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 10/872,895

(22) Filed: Jun. 21, 2004

(65) Prior Publication Data
US 2004/0232468 A1    Nov. 25, 2004

Related U.S. Application Data

(62) Division of application No. 09/998,469, filed on Nov. 29, 2001, now Pat. No. 6,781,184.

(51) Int. Cl.
*H01L 27/108* (2006.01)
(52) U.S. Cl. .................. 257/310; 438/240; 438/785
(58) Field of Classification Search ............. 257/295, 257/303–306, 310, 296; 438/240, 785
See application file for complete search history.

(56) References Cited

U.S. PATENT DOCUMENTS

| | | | |
|---|---|---|---|
| 5,046,043 A | 9/1991 | Miller et al. | |
| 5,434,102 A | 7/1995 | Watanabe et al. | |
| 5,519,234 A | 5/1996 | Paz de Araujo et al. | |
| 5,648,114 A | 7/1997 | Paz De Araujo et al. | |
| 6,051,858 A | 4/2000 | Uchida et al. | |
| 6,121,648 A | 9/2000 | Evans, Jr. | |
| 6,188,098 B1 | 2/2001 | Amanuma | |
| 6,207,465 B1 * | 3/2001 | Cuchiaro et al. | 438/3 |
| 6,351,004 B1 | 2/2002 | Shimada et al. | |
| 6,495,878 B1 | 12/2002 | Hayashi et al. | |
| 6,541,279 B1 | 4/2003 | Hayashi et al. | |

(Continued)

FOREIGN PATENT DOCUMENTS

EP     0 412 185 A1    2/1991

(Continued)

OTHER PUBLICATIONS

Goda et al., "A Novel Surface-Oxidized Barrier-SiN Cell Technology to Improve Endurance and Read-Disturb Characteristics for Gigabit NAND Flash Memories", IEEE, 2000, pp. 33.3.1-33.3.4.

*Primary Examiner*—Hoai Pham
*Assistant Examiner*—Ginette Peralta
(74) *Attorney, Agent, or Firm*—Patton Bogga LLP

(57) ABSTRACT

A hydrogen diffusion barrier in an integrated circuit is located to inhibit diffusion of hydrogen to a thin film of a metal oxide, such as a ferroelectric layered superlattice material, in an integrated circuit. The hydrogen diffusion barrier comprises at least one of the following chemical compounds: strontium tantalate, bismuth tantalate, tantalum oxide, titanium oxide, zirconium oxide and aluminum oxide. The hydrogen barrier layer is amorphous and is made by a MOCVD process at a temperature of 450° C. or less. A supplemental hydrogen barrier layer comprising a material selected from the group consisting of silicon nitride and a crystalline form of one of said hydrogen barrier layer materials is formed adjacent to said hydrogen diffusion barrier.

9 Claims, 9 Drawing Sheets

U.S. PATENT DOCUMENTS

| | | |
|---|---|---|
| 6,611,014 B1 | 8/2003 | Kanaya et al. |
| 6,635,528 B1 | 10/2003 | Gilbert et al. |
| 6,642,563 B1 * | 11/2003 | Kanaya ............... 257/296 |
| 2001/0006241 A1 | 7/2001 | Bee-Lyong |
| 2001/0034106 A1 | 10/2001 | Moise et al. |
| 2002/0038402 A1 | 3/2002 | Kanaya |

FOREIGN PATENT DOCUMENTS

| | | |
|---|---|---|
| EP | 0 915 522 A2 | 5/1999 |
| EP | 1 113 493 A1 | 7/2001 |
| JP | 11121704 | 4/1999 |
| WO | WO 01/75945 A2 | 10/2001 |

* cited by examiner

BARRIER LAYERS FOR PROTECTING METAL OXIDES FROM HYDROGEN DEGRADATION

This application is a divisional application of copending Application Ser. No. 09/998,469 filed Nov. 29, 2001, now U.S. Pat. No. 6,781,184 which application is hereby incorporated by reference.

BACKGROUND OF THE INVENTION

1. Field of the Invention

The invention relates to an integrated circuit having a hydrogen barrier layer to protect elements containing metal oxide materials from degradation in integrated processes utilizing or producing hydrogen, and in particular to specific materials for use in such barrier layers, specific structures for such barrier layers, and processes for making such materials and structures.

2. Statement of the Problem

Metal oxides have been used in integrated circuits, particularly memories. For example, ferroelectric compounds possess favorable characteristics for use in nonvolatile integrated circuit memories. See U.S. Pat. No. 5,046,043 issued Sep. 3, 1991 to Miller et al. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$-type ferroelectric oxides such as PZT (lead titanate zirconate) and PLZT (lanthanum lead titanate zirconate) have been studied for practical use in integrated circuits. Layered superlattice material oxides have also been studied for use in integrated circuits. See U.S. Pat. No. 5,434,102 issued Jul. 18, 1995 to Watanabe et al. Layered superlattice material compounds exhibit characteristics in ferroelectric memories that are orders of magnitude superior to those of PZT and PLZT compounds and also exhibit dielectric constants that make them useful for DRAMS. See, for example, U.S. Pat. No. 5,519,234 issued May 21,1996 to Paz de Araujo et al. Integrated circuit devices containing ferroelectric elements are currently being manufactured. Nevertheless, the persistent problem of hydrogen degradation during the manufacturing process hinders the economical production in commercial quantities of ferroelectric memories and other IC devices using the layered superlattice material and other metal oxide compounds with the desired electronic characteristics.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a thin film containing ferroelectric metal oxide located between a first, bottom electrode and a second, top electrode, the electrodes typically containing platinum. During manufacture of the circuit, the MOSFET is, subjected to conditions causing defects in the silicon substrate. For example, the CMOS/MOSFET manufacturing process usually includes high energy steps, such as ion-mill etching and plasma etching. Defects also arise during heat treatment for crystallization of the layered superlattice material at relatively high temperatures, often in the range of from 500° C. to 900° C. As a result, numerous defects are generated in the single crystal structure of the semiconductor silicon substrate, leading to deterioration in the electronic characteristics of the MOSFET.

To restore the silicon properties of the CMOS/MOSFET, the manufacturing process typically includes a hydrogen annealing step in which defects, such as dangling bonds, are eliminated by utilizing the reducing property of hydrogen. Various techniques have been developed to effect the hydrogen annealing, such as a forming-gas anneal ("FGA"). Conventionally, FGA treatments are conducted under ambient conditions in a $H_2$—$N_2$ gas mixture between 350° C. and 550° C., typically around 400° C. to 450° C., for a time period of about 30 minutes. In addition, the CMOS/MOSFET manufacturing process requires other fabrication steps that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses principally through the top electrode to the layered superlattice material, but also from the side edges of the capacitor, and reduces the oxides contained in the ferroelectric material. The absorbed hydrogen also metallizes the surface of the layered superlattice material by reducing metal oxides. As a result of these effects, the electronic properties of the capacitor are degraded. After the forming-gas anneal (FGA), the remnant polarization of the ferroelectrics is very low and no longer suitable for storing information or the dielectric properties are degraded. An increase in leakage currents also results. In addition, the adhesivity of the layered superlattice material to the upper electrode is lowered by the chemical change taking place at the interface. Alternatively, the upper electrode is pushed up by the oxygen gas, water, and other products of the oxidation-reduction reactions taking place. Thus, peeling is likely to take place at the interface between the top electrode and the layered superlattice material. In addition, hydrogen also can reach the lower electrode, leading to internal stresses that cause the capacitor to peel off its substrate. These problems are acute in ferroelectric memories containing layered superlattice material compounds because these oxide compounds are particularly complex and prone to degradation by hydrogen-reduction.

A related problem encountered in the fabrication of ferroelectric and other metal oxide devices is the stress arising in and between the different circuit layers as a result of the manufacturing processes. The products of the hydrogen reduction reactions cause an increase in the total volume of the metal oxide element. As a result, the material exerts an upward pressure on the layers above it.

Several methods have been reported in the art to inhibit or reverse hydrogen degradation of desired electronic properties in ferroelectric oxide materials. Oxygen-recovery annealing at high temperature (800° C.) for about one hour results in virtually complete recovery of the ferroelectric properties degraded by hydrogen treatments; but the high temperature oxygen anneal itself may generate defects in silicon crystalline structure, and it may offset somewhat the positive effects of any prior forming-gas anneal on the CMOS characteristics. Also, if hydrogen reactions have caused structural damage to the ferroelectric device, such as peeling, then a recovery anneal is not able to effectively reverse the damage.

To reduce the detrimental effects of the hydrogen heat treatment and protect the ferroelectric metal oxide element, the prior art also teaches the application of hydrogen barrier layers to inhibit the diffusion of hydrogen into the ferroelectric material. The barrier layer is typically located over the ferroelectric element, but it can also be located below and laterally to the sides of the element.

Hydrogen degradation is also a problem in complex metal oxides used in nonferroelectric, high-dielectric constant applications in integrated circuits. Hydrogen reactions cause structural damage, as described above for ferroelectric oxides, and cause degradation of dielectric properties. Examples of metal oxides subject to hydrogen degradation include barium strontium titanate ("BST"), barium strontium niobate ("BSN"), certain $ABO_3$-type perovskites, and certain layered superlattice materials, such as strontium bismuth tantalate ("SBT"). Hydrogen barrier layers are, therefore, also used to protect nonferroelectric, high-dielectric constant metal oxides.

A problem associated with utilizing a recovery anneal of an integrated circuit substrate with a hydrogen barrier layer is that the high temperatures employed during the recovery anneal can cause grain growth in the hydrogen barrier layer, thereby changing the amorphous nature and electrical properties of the hydrogen barrier layer. A further problem is that the use of a hydrogen barrier layer in connection with a metal layer, such as aluminum, is that the metal layer cannot withstand temperatures greater than 450° C.

It is known in the art to use a hydrogen barrier layer comprising a nitride of aluminum, silicon or titanium, that is, AlN, $Si_3N_4$, or $Ti_3N_4$. Typically, hydrogen barrier layers known in the art are not completely effective in preventing hydrogen diffusion and the resulting hydrogen degradation of metal oxides. Thus, even when a diffusion barrier is used, it is not uncommon for structural damage to arise in the ferroelectric or dielectric device and for hydrogen to reach the metal oxide layer and degrade the desired ferroelectric or dielectric properties of the metal oxide material.

Therefore, it would be useful to have new materials different from those known in the art to obtain the benefits of a hydrogen barrier layer in protecting ferroelectric and dielectric oxide materials, in particular, ferroelectric layered superlattice materials, from hydrogen degradation.

3. Solution to the Problem p The invention solves the above problem by providing a hydrogen diffusion barrier comprising a material selected from the group consisting of strontium tantalate, tantalum pent-oxide, bismuth tantalate, titanium oxide, tungsten oxide, zirconium oxide and aluminum oxide. The invention also solves the above problem by providing a hydrogen barrier layer that is amorphous. When subjected to the high temperature recovery anneals, these hydrogen barrier layers do not increase in grain growth. This lack of grain growth decreases the manufacturing defects caused by expanding layers within an integrated circuit. In addition, these hydrogen barrier layers can easily be obtained at low deposition temperatures (~450° C. or less) by a deposition technique like MOCVD. Therefore, the hydrogen barrier layer can be deposited on top of the first metal layer without compromising the metallization. Because these hydrogen barrier layers are amorphous and dense even after heating to temperatures of up to 650° C., they retain their electrical and hydrogen barrier properties throughout conventional integrated circuit processing steps. The invention also solves the above problem by providing a multilayer hydrogen barrier layer comprising two different materials. For example, one material may be the amorphous form of a chemical compound while the other material is a crystalline form of the same chemical compound.

The invention provides an integrated circuit comprising: a thin film of metal oxide material; and a hydrogen barrier layer located to inhibit the diffusion of hydrogen to the metal oxide material, the hydrogen barrier layer comprising a material selected from the group consisting of: strontium tantalate, bismuth tantalate, tantalum oxide, titanium oxide, zirconium oxide and aluminum oxide. Preferably, the metal oxide comprises a perovskite. Preferably, the metal oxide comprises a material with a dielectric constant of 20 or more. Preferably, the metal oxide comprises a ferroelectric material. Preferably, the metal oxide comprises a layered superlattice material. Preferably, the layered superlattice material comprises one or more of the following chemical elements: strontium, calcium, barium, bismuth, lead, yttrium, scandium, lanthanum, antimony, chromium, thallium, titanium, tantalum, hafnium, tungsten, niobium, zirconium, oxygen, fluorine and chlorine. Preferably, the layered superlattice material comprises a material selected from the group comprising strontium bismuth tantalate, strontium bismuth niobate, and solid solutions thereof. Preferably, the layered superlattice material comprises strontium, bismuth, tantalum and niobium in relative molar proportions corresponding to the stoichiometric formula $SrBi_y(Ta_{1-x}Nb_x)_2O_9$, wherein $0 \leq x \leq 1$ and $2.0 \leq y \leq 2.2$. Preferably, the hydrogen barrier layer material comprises a material selected from the group consisting of strontium tantalate, bismuth tantalate, and tantalum oxide. Preferably, the hydrogen barrier layer material comprises strontium tantalate. Preferably, the integrated circuit comprises a capacitor having a first electrode and a second electrode, and the metal oxide material is located between the first and second electrodes. Preferably, the capacitor is a ferroelectric capacitor and the metal oxide comprises a ferroelectric material. Preferably, the ferroelectric material comprises a layered superlattice material. Preferably, the integrated circuit comprises a field effect transistor (FET) comprising a substrate and a gate electrode, and the metal oxide material is located between the substrate and the gate electrode. Preferably, the FET is a ferroelectric FET and the metal oxide material comprises a ferroelectric material. Preferably, the ferroelectric material comprises a layered superlattice material. Preferably, the hydrogen barrier layer is between 30 nanometers and 100 nanometers (nm) thick. More preferably, the hydrogen barrier layer is between 70 nm and 90 nm thick. Preferably, the hydrogen barrier layer material is amorphous. Preferably, the integrated circuit includes a semiconducting substrate and the metal oxide material is located between the hydrogen barrier layer and the substrate. Preferably, the integrated circuit includes a wiring layer and the integrated circuit further comprises a second hydrogen barrier layer located above the wiring layer. Preferably, the integrated circuit further includes a substrate and a wiring layer, the metal oxide material is located between the wiring layer and the substrate, and the hydrogen barrier layer is located above the wiring layer.

In another aspect, the invention provides an integrated circuit comprising a thin film of metal oxide material; a hydrogen barrier layer located to inhibit the diffusion of hydrogen to the metal oxide material, the hydrogen barrier layer comprising an amorphous material; and a capping layer completing the integrated circuit. Preferably, the integrated circuit comprises a capacitor having a first electrode and a second electrode, and the metal oxide material is located between the first and second electrodes. Preferably, the capacitor is a ferroelectric capacitor and the metal oxide comprises a ferroelectric material. Preferably, the ferroelectric material comprises a layered superlattice material. Preferably, the integrated circuit comprises a field effect transistor (FET) comprising a substrate and a gate electrode, and the metal oxide material is located between the substrate and the gate electrode. Preferably, the FET is a ferroelectric FET and the metal oxide material comprises a ferroelectric material. Preferably, the ferroelectric material comprises a layered superlattice material. Preferably, the hydrogen barrier layer is between 30 nanometers and 100 nanometers (nm) thick. Preferably, the amorphous material has a crystallization temperature greater than 650° C.

In a further aspects the invention provides an integrated circuit comprising a thin film of metal oxide material; and a hydrogen barrier layer located to inhibit the diffusion of hydrogen to the metal oxide material, the hydrogen barrier layer comprising a primary hydrogen barrier layer material and a supplemental hydrogen barrier layer material, the primary hydrogen barrier layer material being different than the supplemental hydrogen barrier layer material, and wherein the primary and supplemental materials are either both conducting or both insulating. Preferably, the supplemental material is located in contact with the primary material. Preferably, the primary material and the secondary material are both conducting. Preferably, the primary material and the secondary material are both insulating. Preferably, the primary material is more compatible with the metal oxide material and is located closer to the metal oxide material. Preferably, the primary material comprises one of the chemical elements that is in the metal oxide material. Preferably, the metal oxide material is a layered superlattice material. Preferably, the primary material comprises material selected from the group consisting of: strontium tantalate, bismuth tantalate, tantalum oxide, titanium oxide, zirconium oxide, and aluminum oxide. Preferably, the supplemental material comprises a material selected from the group consisting of silicon nitride and alumina.

In still a further aspect, the invention provides a method of making an integrated circuit comprising: providing a substrate; depositing a metal oxide thin film on the substrate; forming a hydrogen barrier layer over the metal oxide thin film, the hydrogen barrier layer comprising a material selected from the group consisting of: strontium tantalate, bismuth tantalate, tantalum oxide, titanium oxide, zirconium oxide and aluminum oxide; and performing an integrated circuit fabrication process utilizing or producing hydrogen; wherein the step of forming includes locating the hydrogen barrier layer in a location where it inhibits diffusion of the hydrogen into the metal oxide thin film. Preferably, the step of forming a hydrogen barrier layer comprises metalorganic chemical vapor deposition (MOCVD) of a liquid precursor. Preferably, the MOCVD is conducted at a temperature of between 300° C. and 650° C. More preferably, the temperature is between 400° C. and 500° C. Most preferably, the temperature is 450° C. or less. Preferably, the liquid precursor includes an organic solvent which comprises at least one compound selected from the group consisting of tetrahydrofuran, methyl ethyl ketone, isopropanol, methanol, xylene, n-butyl acetate, octane, 2-methoxyethanol, toluene, diethylethane, 1,4-dioxane and hexane. Preferably, the organic solvent is toluene. Preferably, the liquid precursor comprises a double alkoxide. Preferably, the double alkoxide comprises a double ethoxide. Preferably, the ethoxide comprises strontium tantalum penta ethoxide-2-methoxy ethoxide.

In still a further aspect, the invention provides a method of making an integrated circuit comprising: providing a substrate; depositing a metal oxide thin film on the substrate; forming a hydrogen barrier layer over the metal oxide thin film using metalorganic chemical vapor deposition, (MOCVD) of a liquid precursor; and performing an integrated circuit fabrication process utilizing or producing hydrogen; wherein the step of forming includes locating the hydrogen barrier layer in a location where it inhibits diffusion of the hydrogen into the metal oxide thin film. Preferably, the MOCVD is conducted at a temperature of between 300° C. and 650° C. More preferably, the temperature is between 400° C. and 500° C. Most preferably, the temperature is 450° C. or less.

In yet another aspect, the invention provides a method of making an integrated circuit comprising: providing a substrate; depositing a metal oxide thin film on the substrate; forming a hydrogen barrier layer over the metal oxide thin film; and performing an integrated circuit fabrication process utilizing or producing hydrogen; wherein the step of forming is entirely performed at a temperature of 600° C. or less. Preferably, the step of forming is entirely performed at a temperature of 450° C. or less.

In yet a further aspect, the invention provides a method of making an integrated circuit comprising: providing a substrate; depositing a metal oxide thin film on the substrate; forming an amorphous hydrogen barrier layer over the metal oxide thin film; and performing an integrated circuit fabrication process utilizing or producing hydrogen, while the amorphous hydrogen barrier layer inhibits diffusion of the hydrogen into the metal oxide thin film. Preferably, the method further includes the step of forming a supplemental hydrogen barrier layer adjacent to the amorphous hydrogen barrier layer, wherein the supplemental hydrogen barrier layer is a different material than the amorphous hydrogen barrier layer. Preferably, the supplemental hydrogen barrier layer comprises essentially the same chemical elements as the supplemental hydrogen barrier layer except it is crystalline. Preferably, the supplemental hydrogen barrier layer is crystalline.

Numerous other features, objects and advantages of the invention will become apparent from the following description when read in conjunction with the accompanying drawings.

DETAILED DESCRIPTION OF THE PREFERRED EMBODIMENT

1. Overview and Description of Integrated Circuit

Figure 1:
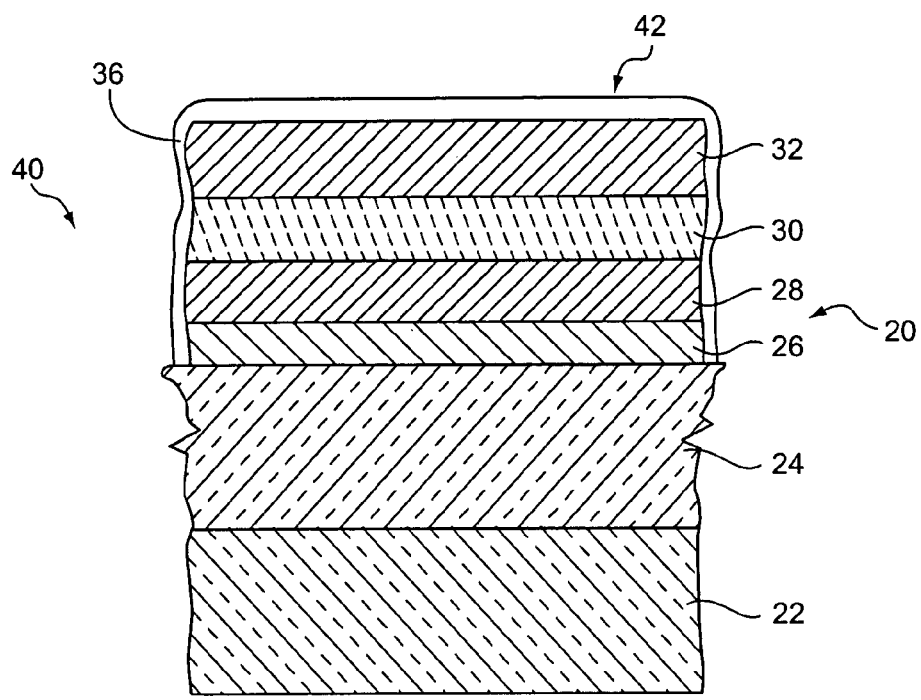
FIG. 1 is a cross-sectional diagram of a capacitor with a hydrogen barrier layer according to the invention.

In FIG. 1, there is shown a cross-sectional view of a capacitor 40 containing a metal oxide 30 with insulating hydrogen barrier layer 36 in accordance with the invention. Capacitor 40 preferably is part of an integrated circuit, but also may be a bypass capacitor in a MMIC or other electronic component containing a metal oxide. It should be understood that the invention can be used in any context in which hydrogen processing of metal oxide electronic components occurs. Integrated circuit capacitor 40 is preferably formed on a wafer 22 that may be silicon, gallium arsenide, ruby or other semiconductor, or an insulator, such as glass or magnesium oxide (MgO). In the preferred embodiments described herein, it is a P-type silicon wafer of about 15 centimeters to 20 centimeters in diameter. Preferably, it is a single crystal.

Layer 24 of about 500 nm of silicon dioxide is grown on silicon wafer 22 by conventional methods. In the preferred embodiment, a titanium adhesion layer 26 is preferably formed by sputtering 20 nm of titanium on layer 24. As is known in the art, the titanium assists in adhering platinum layer 28 to oxide layer 24. Platinum layer 28 preferably is about 200 nm thick and formed by sputtering. The incomplete device is then annealed in an oxygen furnace, preferably for 30 minutes at 650° C. The annealing in oxygen serves, among other things, to stabilize the titanium/platinum electrode. Next, metal oxide layer 30 is formed on first electrode 28, as will be described in detail below. Then second electrode 32 is formed, preferably by sputtering another 200 nm thick layer of platinum. Further details of the capacitor formation process will be described below.

Figure 2:
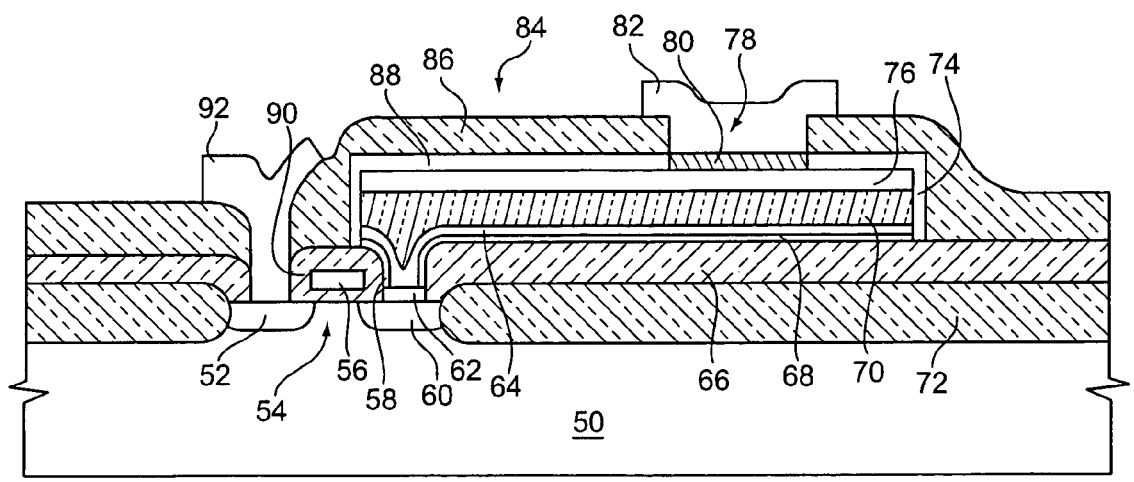
FIG. 2 is a cross-sectional diagram of an integrated circuit with a hydrogen barrier layer according to the invention.

A charge storage cell 84 in which the invention may be used is shown in FIG. 2. Cell 84 is formed on a silicon substrate 50, and includes field oxide areas 72, and two electrically interconnected electrical devices, a transistor 54, and a capacitor 78. Transistor 54 includes a source 52, a drain 60, a gate 56, and a gate dielectric 90. Capacitor 78 includes first or bottom electrode 64, which, optionally, can include a conductive barrier layer 68, which may be made of any of the conductive barrier layer materials mentioned above. Capacitor 78 also includes a metal oxide layer 70, and second or top electrode 76. Conducting hydrogen barrier layer 80 electrically connects top electrode 76 and electrical contact 82. Conducting hydrogen barrier layer 80 preferably comprises a nitride of titanium, but also may be a nitride of copper or tungsten, a nitride of aluminum, or a nitride of aluminum and another chemical element selected from the group consisting of silicon, titanium, tantalum, niobium, copper, and tungsten. An inventive aspect of the invention is the insulating hydrogen barrier layer 88. Insulating barrier layer 88 preferably is deposited over top electrode 76, metal oxide layer 70, and bottom electrode 64. Preferably, it is deposited directly over these layers so it is in contact with these layers. However, in some embodiments, the side portions 74 of layer 88 may not be used. Insulating hydrogen barrier layer 88 comprises at least one chemical compound selected from the group consisting of strontium tantalate, bismuth tantalate, and tantalum oxide. Interlayer dielectrics, such as 86, separate devices 54 and 78, except where drain 60 of transistor 54 is connected to conducting adhesion layer 62. Electrical contacts, such as 92, make electrical connection to devices 54 and 78 and to other parts of storage charge cell 84. If layer 70 is a high dielectric constant material, integrated circuit charge storage device 84 is a DRAM cell; if layer 70 is a ferroelectric, then device 84 is a FERAM cell. Here, "high dielectric constant" means a dielectric constant of 20 or more.

Figure 3:
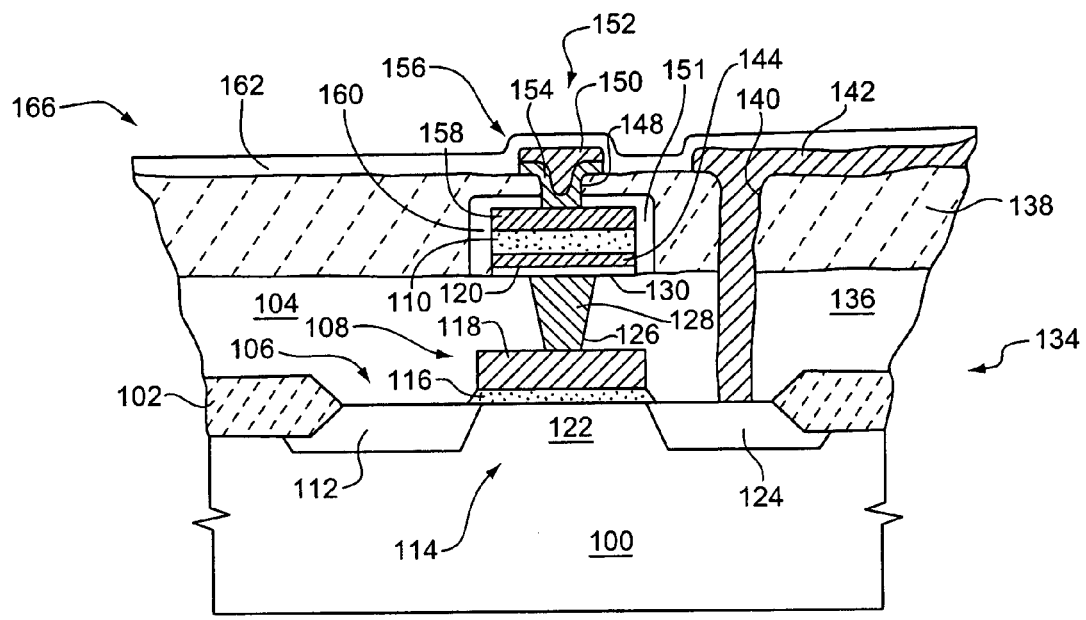
FIG. 3 is a cross-sectional diagram of a MFM-MIS memory cell in an integrated circuit with a hydrogen barrier layer according to the invention.

FIG. 3 shows a cross-sectional view of a portion of a MFM-MIS FET memory 166 including a memory cell 152 according to a preferred embodiment of the invention. The MFM-MIS FET memory cell 152 comprises a field effect transistor ("FET") 114, a metal-ferroelectric-metal ("MFM") capacitor 156, and an interconnect 128. Metal-insulator-semiconductor ("MIS") capacitor 108 forms a portion of FET 114. The individual components that make up the combination, i.e., each of FET 114, MIS 108, MFM 156, and interconnect 128 can be manufactured using standard techniques for manufacturing MOSFETs and FeRAMS. The MFM-MIS FET memory 166 is formed on a wafer 134, comprising a standard semiconductor material 100, preferably p-100 crystalline silicon. Semiconductor substrate 106 comprises semiconductor material 100, source region 112, drain region 124, channel region 122, and gate oxide layer 166. A field oxide layer 102, typically thermally oxidized silicon oxide or SiON, is formed on semiconducting substrate 100 using conventional techniques. Semiconductor substrate 100 also comprises a highly doped source region 112 and a highly doped drain region 124, which are formed about channel region 122 using conventional techniques. Doped source region 112 and drain region 124 are preferably n-type doped regions. Gate oxide layer 116 is located above channel region 122, and gate electrode 118 is located above gate oxide layer 116, both of which are preferably formed by conventional techniques. FET 114 comprises source region 112, drain region 124, channel region 122, gate oxide layer 116 and gate electrode 118. MIS capacitor 108 comprises gate electrode 118, gate oxide 116 and semiconductor substrate 106. FET 114 and MIS 108 are covered by a standard interlayer dielectric ("ILD") 104, comprising a glasseous oxide, preferably a boron-doped phosphosilicate glass ("BPSG"). A via 126 from the top ILD 136 down to the surface of gate electrode 118 is filled with interconnect 128, also referred to herein as the conventional term of conductive plug 128. Conductive plug 128 typically comprises polycrystalline silicon or tungsten, preferably silicon. Conducting hydrogen barrier layer 120 having a bottom surface 130 is located on ILD 136, covering conductive plug 128. A bottom electrode 144 having a bottom surface is located on conducting hydrogen barrier layer 120. Conductive plug 128 electrically connects gate electrode 118 to bottom surface 130 of conducting hydrogen barrier layer 120. Conducting hydrogen barrier layer 120 comprises any of the conducting barrier layer materials mention above. A metal oxide material 110 is located on bottom electrode 144, and top electrode 158 is located on metal oxide material 110. Metal oxide material 110 preferably comprises a ferroelectric layered superlattice material, such as strontium bismuth tantalate, a particular formulation of which is $Sr_{0.9}Bi_{2.2}Ta_2O_9$, but may also include a non-ferroelectric layered superlattice material, a ferroelectric or non-ferroelectric $ABO_3$-type material, i.e., a perovskite, or other ferroelectric metal oxide material or dielectric material, particularly high dielectric constant materials. Bottom electrode 144, metal oxide 110, and top electrode 158 together form ferroelectric MFM capacitor 156. A second interlayer dielectric, ILD 138, covers ILD 136 and MFM 156. A wiring hole 148 extends through ILD 138, with local interconnect 150 filling wiring hole 148 connecting conductive hydrogen barrier layer 154 to a line through which a write-voltage is typically applied. A wiring hole 142 extends through ILD 138 and ILD 136 to drain region 124. Local interconnect 140 fills wiring hole 142 and electrically connects drain region 124 to a line through which a read-voltage is applied and to a source-to-drain current sensor (not shown). Source region 112 is generally connected to a voltage source (not shown) either through patterning of doped area 112 in substrate 100 or by way of a local interconnect (not shown). After the formation of the wiring layer interconnects, a second insulating hydrogen barrier layer 162 is deposited. This hydrogen barrier layer preferably is made of at least one chemical compound selected from the group consisting of strontium tantalate, bismuth tantalate, and tantalum oxide.

Insulating hydrogen barrier layer 160 preferably encloses MFM capacitor 156 together with conducting hydrogen barrier layer 120 and conducting hydrogen barrier layer 154. Optionally, all or a portion of the sidewalls 151 of barrier layer 160 may not be formed. Hydrogen barrier layer 120 is also optional. Insulating hydrogen barrier layer 160 comprises at least one chemical compound selected from the group consisting of strontium tantalate, bismuth tantalate, and tantalum oxide. Insulating hydrogen barrier layer 160 is preferably deposited onto MFM-MIS FET memory 166 by MOCVD. The deposition temperature for insulating hydrogen barrier layer 160 is between 350° C. and 650° C., and the pressure in the deposition chamber is between 0 mbars and 10 mbars, and preferably from 1 mbar and 10 mbar. The oxygen flow in the deposition chamber is between 400 cubic centimeters per minute and 1200 cubic centimeters per minute (ccm). The carrier gas flow is between 50 ccm and 500 ccm. The film thickness of insulating hydrogen barrier layer 160 is between 200 Å and 1200 Å.

U.S. Pat. No. 5,519,234, issued May 21, 1996 to Paz de Araujo et al., incorporated herein by reference as though fully disclosed herein, discloses that layered superlattice compounds, such as strontium bismuth tantalate (SBT), have excellent properties in ferroelectric applications as compared to the best prior art materials and have high dielectric constants and low leakage currents.

The layered superlattice materials may be summarized generally under the formula:

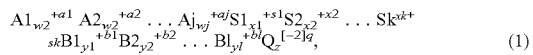
(1)

where $A1, A2 \ldots Aj$ represent A-site elements in the perovskite-like structure, which may be elements such as strontium, calcium, barium, bismuth, lead, and others; $S1, S2 \ldots Sk$ represent superlattice generator elements, which usually is bismuth, but can also be materials such as yttrium, scandium, lanthanum, antimony, chromium, thallium, and other elements with a valence of +3; $B1, B2 \ldots Bl$ represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc.

The superscripts in Formula (1) indicate the valences of the respective elements. For example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary throughout the material, e.g., in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and $w2 \ldots wj$ all equal zero. If there is only one B-site element in the compound, then it is represented by the "B1" element, and $y2 \ldots yl$ all equal zero, and similarly for the superlattice generator elements. The usual case is that there is one A-site element, one superlattice generator element, and one or two B-site elements, although Formula (1) is written in the more general form since the invention is intended to include the cases where either of the sites and the superlattice generator can have multiple elements. The value of z is found from the equation:

$$(a1w1+a2w2 \ldots +ajwj)+(s1x1+s2x2 \ldots +skxk) \\ +(b1y1+b2y2 \ldots +blyl)=qz. \quad (2)$$

Formula (1) includes all three of the Smolenskii type compounds discussed in U.S. Pat. No. 5,519,234, issued May 21, 1996 to Paz de Araujo et al., which is hereby incorporated by reference as though fully incorporated herein. The layered superlattice materials do not include every material that can be fit into Formula (1), but only those which spontaneously form themselves into crystalline structures with distinct alternating layers. It has been shown that certain layered superlattice materials possess characteristics well-suited for conventional nonvolatile memory applications, such as high polarizability, high resistance to fatigue, low leakage current, low imprint, and suitable coercive voltage values.

Figure 4:
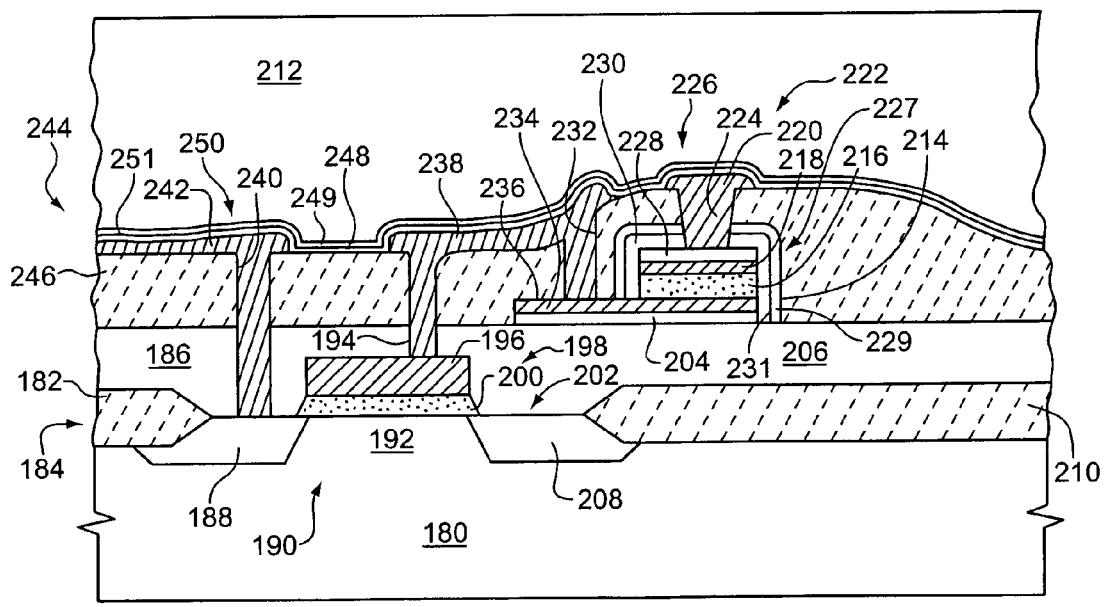
FIG. 4 is a cross-sectional diagram of a MFM-MIS capacitor in an integrated circuit with a hydrogen barrier layer according-to the invention.

An alternative embodiment of the invention is depicted in FIG. 4. In FIG. 4, a portion of MFM-MIS FET memory 244 including memory cell 222 comprises FET 190, MFM capacitor 226, and interconnect 238. MIS capacitor 198 forms part of FET 190. MFM capacitor 226 is displaced laterally with respect to FET 190. The structure of memory 244, other than the inventive hydrogen barrier layers disclosed herein, may be manufactured using conventional processes applied to standard MOSFETs and FeRAMs. The MFM-MIS FET memory cell 222 is formed on a wafer 184, comprising standard semiconductor material 180, preferably p-100 crystalline silicon. A field oxide layer 210, typically thermally oxidized silicon oxide, is formed from semiconductor material 180. A source region 208 and a drain region 188 are formed about a channel region 192. Gate oxide layer 200 is located above channel region 192, and gate electrode 196 is located above gate oxide layer 200. Semiconductor substrate 202 comprises semiconductor material 180, source region 208, drain region 188, channel region 192, and gate oxide layer 200. FET 190 comprises source region 208, drain region 188, channel region 192, gate oxide layer 200 and gate electrode 196 together. FET 190 and MIS 198 are covered by a first interlayer dielectric ("ILD") 206, comprising a glasseous oxide, preferably a boron-doped phosphosilicate glass ("BPSG").

Insulating hydrogen barrier layer 204 is located on ILD 206. A bottom electrode 234 has an upper surface 236. A metal oxide layer 216 is located on a portion of bottom electrode 234, and top electrode 218 is located on metal oxide layer 216. Conducting hydrogen barrier layer 228 is located between top electrode 218 and hydrogen barrier layer 227. Hydrogen barrier layer 227 is formed of primary hydrogen barrier layer 230, which is insulating, and supplemental hydrogen barrier layer 229, which is preferably insulating. A conductive plug 220 is formed in a via 224 in contact with conducting hydrogen barrier layer 228. Hydrogen barrier layers 204 and 227 together with hydrogen barrier layer 228 preferably enclose MFM capacitor 226. Optionally, all or a portion of the sidewall 214 of hydrogen barrier layer 230 may not be formed. Bottom hydrogen barrier layer 204 is also optional, or may be formed of one of the conducting barrier layer materials mentioned above. Insulating hydrogen barrier layer 230 is preferably is in contact with conducting barrier layer 228, top electrode 218, metal oxide layer 216 and bottom electrode 234. Insulating hydrogen barrier layers 204, 230 comprise at least one chemical compound selected from the group consisting of strontium tantalate, bismuth tantalate, and tantalum oxide. Insulating hydrogen barrier layers 204, 230 are preferably deposited onto MFM-MIS FET memory 244 by MOCVD. The deposition temperature for insulating hydrogen barrier layers 204, 230 is between 350° C. and 650° C. and the pressure in the deposition chamber is between 0 mbars and 10 mbars. The oxygen flow in the deposition chamber is between 400 cubic centimeters per minute and 1200 cubic centimeters per minute (ccm). The carrier gas flow is between 50 ccm and 500 ccm.

The film thickness of insulating hydrogen barrier layers 204, 230 is between 200 Å and 1200 Å. The embodiment of FIG. 4 differs from the embodiments of FIGS. 2 and 3 in that insulating hydrogen barrier layer 230 adjacent the metal oxide is formed on conducting hydrogen barrier layer 228, and preferably directly on, i.e., in contact with, layer 228. Metal oxide 216 comprises one or more of the same materials discussed above with respect to metal oxide layer 110. Bottom electrode 234, metal oxide 216, and top electrode 218 together form MFM capacitor 226.

FIG. 4 also illustrates another feature of the invention; namely, that hydrogen barrier layer 227 is a multiple layer barrier, and that it comprises supplemental hydrogen barrier layer 229 adjacent primary barrier layer 230. Supplemental hydrogen barrier layer 229 is made of a different material than barrier layer 230. Preferably, it is made of a dielectric material, and most preferably silicon nitride or alumina, but may be any other material that is useful as a hydrogen barrier layer. In one embodiment, the primary barrier layer is amorphous and the supplemental barrier layer is crystalline, preferably the crystalline form of the material of which the primary layer is made. The use of a multiple layer hydrogen barrier has many advantages. It permits a supplemental hydrogen barrier layer 229 that is not fully compatible chemically with the materials of capacitor 226, and in particular metal oxide 216, to be used, because primary barrier layer 230, which is highly compatible chemically with capacitor 226, and in particular metal oxide 216, screens supplemental barrier layer 229 from direct contact with capacitor 226, and in particular metal oxide 216. It also creates an interface 231 between two dissimilar hydrogen barrier layer materials, which interface is a highly effective trapping site for hydrogen.

A second interlayer dielectric, ILD 246, covers ILD 186 and MFM capacitor 226. A wiring hole 194 extends through ILD 246 and ILD 186 to gate electrode 196. Wiring hole 232 extends through ILD 246 to upper surface 236 of bottom electrode 234. Local interconnect 238 fills wiring holes 194, 232 and electrically connects gate electrode 196 and bottom electrode 234. A wiring hole 224 extends through ILD 246 to conducting hydrogen barrier layer 228. Local interconnect 220 fills wiring hole 224, electrically connecting conducting hydrogen barrier layer 228 to a write-voltage (not shown). A wiring hole 240 extends through ILD 246 and ILD 206 to drain region 188. Local interconnect 242 fills wiring hole 220 and electrically connects drain region 188 to a read-voltage and a source-to-drain current sensor (not shown). Source region 208 is connected to a voltage source (not shown) either through patterning of doped area 208 in substrate 202 or by way of a local interconnect (not shown). After the formation of the wiring layer interconnects, a second insulating hydrogen barrier layer 250 is preferably formed. This hydrogen barrier layer 250 is preferably a multiple layer hydrogen barrier layer, comprising a primary hydrogen barrier layer 248 and supplemental hydrogen barrier layer 249, having an interface 251. Primary barrier layer 249 is preferably is made of at least one chemical compound selected from the group consisting of strontium tantalate, bismuth tantalate, and tantalum oxide. Supplemental hydrogen barrier layer 249 is preferably made of silicon nitride or alumina, but may be made of any other dielectric material that is compatible with ILD 212 and primary barrier layer 248, and capable of forming an interface 251. In one embodiment, the primary barrier layer is amorphous and the supplemental barrier layer is crystalline, preferably the crystalline form of the material of which the primary layer is made. Other wiring layers and a capping layer 212 are deposited as known in the art to complete the integrated circuit.

Figure 5:
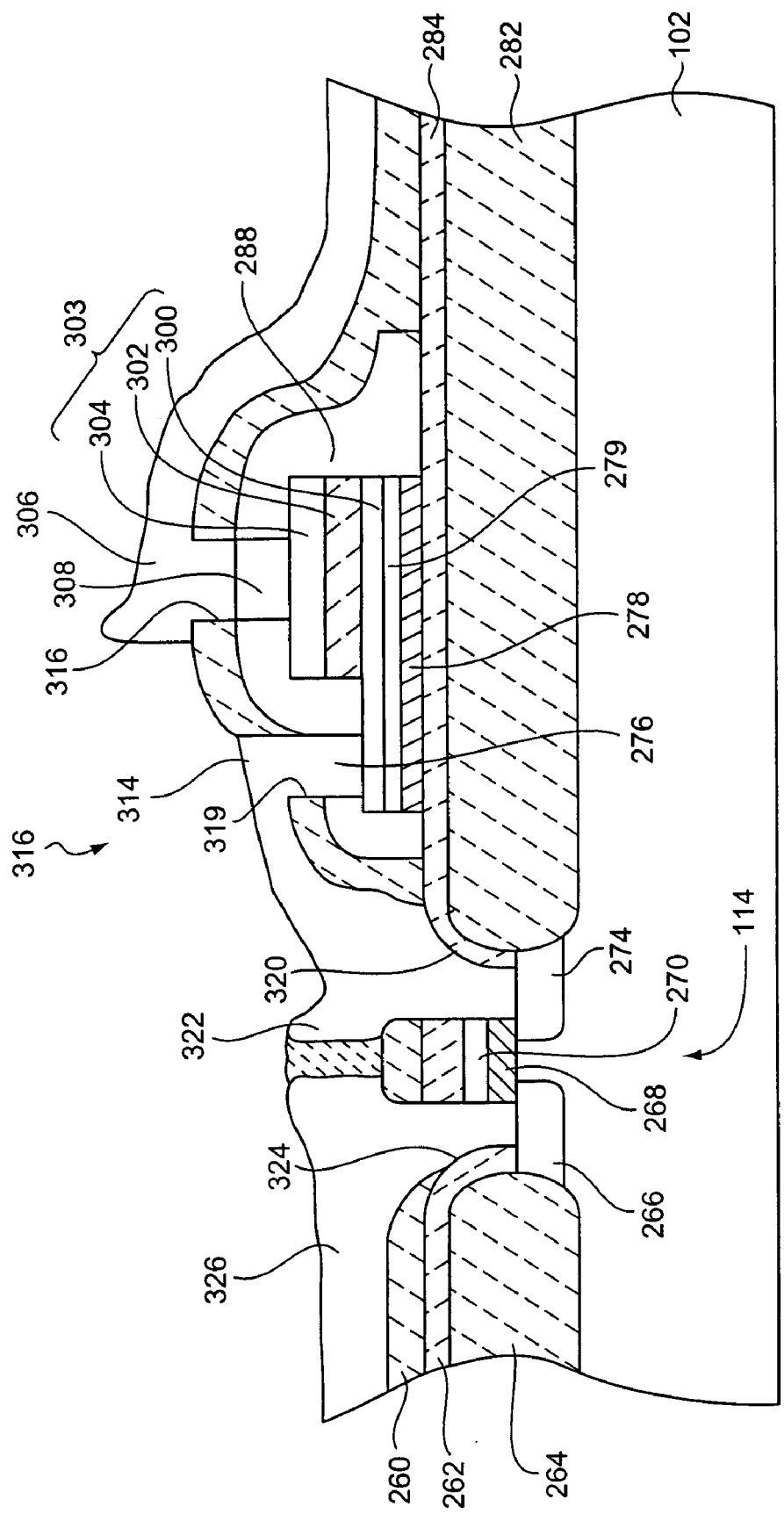
FIG. 5 is a cross-sectional diagram of a ferroelectric memory with a MOSFET in an integrated circuit with a hydrogen barrier layer according to the invention.

Another variation of the invention is shown in FIG. 5. As depicted in FIG. 5, integrated circuits memory cell 316 is preferably formed on a wafer 280 that may be silicon, gallium arsenide, ruby or other semiconductor, or an insulator, such as glass or magnesium oxide (MgO). In the preferred embodiment described herein, it is a P-type silicon wafer of about 15 centimeters to 20 centimeters in diameter. Preferably, it is a single crystal. Layer 282 of about 500 nm of silicon dioxide is grown on silicon wafer 280 by conventional methods. A gate electrode 270 is formed on top of gate insulator 268 followed by ILD 284, then an optional insulating hydrogen barrier layer 278 may be deposited on ILD 284. Layer 278 may alternatively be a conductive hydrogen barrier layer. A titanium adhesion layer 279 is formed by sputtering 20 nm of titanium on barrier layer 278, or on ILD 284 if barrier layer 278 is not present. A bottom electrode layer 300 made of platinum and having a thickness of 200 nm is deposited on titanium layer 279, then a metal oxide 302 is formed on bottom electrode layer 300. A top electrode layer 304, made of platinum and having a thickness of 200 nm, is formed on layered superlattice material layer 302. Electrode layers 300 and 304 together with metal oxide 302 form capacitor 303. The composition of metal oxide layer 302 is discussed in detail above.

A conducting hydrogen barrier layer 308 is deposited on top electrode layer 304. Conducting hydrogen barrier layer 308 has a thickness in the range of from 50 nm to 400 nm, preferably in the range of 100 nm to 200 nm. Conducting hydrogen barrier layer 308 is preferably made of one of the materials discussed above with respect to the other conducting barrier layers. Layers 300, 302, 304 are patterned, in as few as two patterning process steps, to form stacked capacitor 303.

Insulating hydrogen barrier layer 288, together with conducting hydrogen barrier layer 308 and hydrogen barrier layer 278, preferably encloses capacitor 303, though as before, optionally, the entire capacitor may not be enclosed.

Insulating hydrogen barrier layer 288 preferably is in direct contact with top electrode 304, metal oxide 302, and bottom electrode 300. Insulating hydrogen barrier layer 288 preferably comprises at least one chemical compound selected from the group consisting of strontium tantalate, bismuth tantalate, and tantalum oxide.

A second interlayer dielectric layer (ILD) 260 made of NSG (nondoped silicate glass) is deposited to cover ILD 262, ferroelectric capacitor 303 and hydrogen barrier layers 312, 308 and 288. A PSG (phospho-silicate glass) film or a BPSG film could also be used in layer 260.

ILD 260 is patterned to form wiring holes for electrical contacts to MOSFET 272 and ferroelectric capacitor 303. Wiring hole 324 is selectively opened through ILD 260 and ILD 262 to expose source region 266, and wiring hole 320 is selectively opened through ILD 260 and ILD 262 to expose drain region 266. Wiring hole 318 is selectively opened through ILD 260 to expose a portion of bottom electrode 300. Wiring hole 310 is selectively opened through ILD 260 to expose conducting hydrogen barrier layer 308. Source electrode wiring 326 and drain electrode wiring 322 are formed to fill wiring holes 324 and 320, respectively. Bottom electrode wiring 314 and top electrode wiring 306 are formed to fill wiring holes 318 and 310, respectively. Drain electrode wiring 322 is electrically connected to bottom electrode wiring 314, and preferably is the same wiring element. Each of these wirings 326, 322, 314 and 310 preferably comprises Al—Si with a thickness of about 300 nm.

Figure 6:
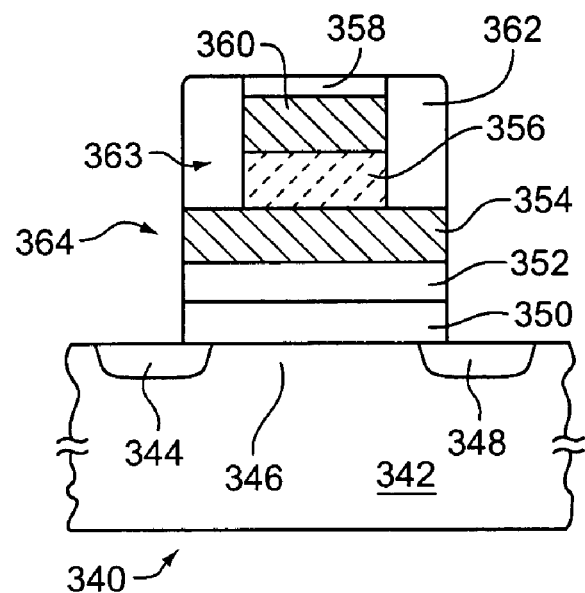
FIG. 6 is a cross-sectional diagram of a MFMISFET with a hydrogen barrier layer according to the invention.

FIG. 6 shows a MFMISFET 340 according to the invention. This FET is formed on a semiconductor substrate 342, and includes source/drains 344 and 348, channel 346, metal oxide 356, electrode 360, and floating gate electrode 354. In this embodiment, conducting hydrogen barrier layer 352 is formed above gate insulator 350. Insulating hydrogen barrier layer 362, conducting hydrogen barrier layer 358 and bottom electrode 354 preferably enclose metal oxide 356. Preferably, the metal oxide is ferroelectric, making the structure 340 a ferroelectric field effect transistor. Insulating hydrogen barrier layer 362 comprises at least one chemical compound selected from the group consisting of strontium tantalate, bismuth tantalate, and tantalum oxide. The composition of metal oxide layer 356 is discussed in detail above.

Figure 7:
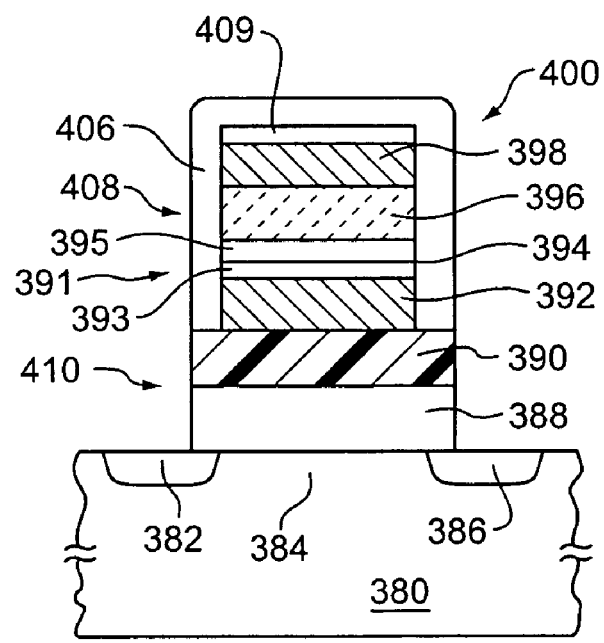
FIG. 7 is a cross-sectional diagram of a MFMISFET with a hydrogen barrier layer according to the invention.

FIG. 7 shows a MEMISFET 400 that includes a polysilicon layer 390 between electrode 392 and insulating layer 388. This FET is again formed on a semiconductor 380, and includes source/drains 382 and 386, channel 384, hydrogen barrier layer 391, metal oxide 396, and bottom electrode 392. Preferably, metal oxide 396 is ferroelectric, making structure 400 a ferroelectric field effect transistor. Hydrogen barrier layer 391 preferably comprises a multilayer barrier layer and includes primary barrier layer 395 and supplemental barrier layer 393. Both layers 393 and 395 are preferably conducting, but one or both may be insulating. As indicated above, the use of a multiple layer hydrogen barrier has many advantages. It permits a supplemental hydrogen barrier layer 393 that is not fully compatible chemically with the materials of metal oxide 396 to be used, because primary barrier layer 395, which is highly compatible chemically with metal oxide 396, screens supplemental barrier layer 393 from direct contact with metal oxide 396. It also permits the use of a supplemental barrier layer 393 that is more compatible with electrode 392 and the layers below it, such as polysilicon. It further creates an interface 231 between two dissimilar hydrogen barrier layer materials, which interface is a highly effective trapping site for hydrogen. The embodiment of FIG. 7 is also shown with linear, or MIS, capacitor 410 formed by polysilicon layer 390, insulator 388, and channel 384, having a larger area than metal oxide capacitor 408, which is sometimes referred to as a MFIM capacitor 408 when metal oxide 396 is ferroelectric. In this embodiment, electrode 392 is shown having the area of metal oxide capacitor 408, although it also could have the area of insulator capacitor 410. Insulating hydrogen barrier layer 406 and hydrogen barrier layer 391 preferably enclose metal oxide 396, though not all of these layers may be used. Insulating hydrogen barrier layer 406 preferably directly contacts top electrode 398, metal oxide 396, hydrogen barrier layer 391k and bottom electrode 392. Insulating hydrogen barrier layer 406, and primary hydrogen barrier layer 395, if it is insulating, preferably comprises at least one chemical compound selected from the group consisting of strontium tantalate, bismuth tantalate, and tantalum oxide. Layer 391, if it is conducting, comprises one of the conducting barrier materials discussed above. The composition of metal oxide layer 396 is discussed in detail above. In this embodiment, gate electrode 398 extends into the paper and electrical connection is made to it in a manner similar to the manner in which electrical connection is made to word lines in the prior art.

Generally, in the art, the word "substrate" can mean the underlying wafer on which the integrated circuit is formed, such as silicon substrate 22. It may also mean any object or surface on which a material layer is directly deposited, such as BPSG layer 116. In this disclosure, "substrate" shall mean the object or surface to which the layer of interest is applied; for example, when talking about a bottom electrode, such as 122, the substrate on which it is deposited includes layers 118 and 116, on which electrode 122 is formed.

The term "thin film" is used herein as it is used in the integrated circuit art. Generally, it means a film of less than a micron in thickness. The thin films disclosed herein are in all instances less than 0.5 microns in thickness. Preferably, the hydrogen barrier layers of the invention are in the range of 30 nm to 1000 nm. These thin films of the integrated circuit art should not be confused with the layered capacitors of the macroscopic capacitor art which are formed by a wholly different process which is incompatible with the integrated circuit art.

It should be understood that the above embodiments are exemplary, and not intended to be limiting. Any of the features of one of the above embodiments and the processes described below can be combined with features of other of the embodiments and processes. For example, the arrangement of insulating barrier layer 406 with conducting barrier layer 404 In FIG. 7 can used in combination with the stacked structure of capacitor 156 in FIG. 3 and with transistor 154 of FIG. 2. That is, capacitor 78 of FIG. 2 can be replaced with a stacked capacitor on top of a thick ILD layer as shown in FIG. 3, and hydrogen barrier layer structures 160, 154 of FIG. 3 can be replaced by a structure similar to hydrogen barrier layer structures 406, 404 of FIG. 7. Clearly, many other combinations, too numerous to express here without unduly lengthening the disclosure, can be made by those skilled in the art. In addition, it should be understood that the various drawings are not to scale. For example, the relative thickness of the various layers are not accurate, since if they were made accurate, it would be difficult to illustrate the invention within the drawing sizes proscribed by the United States Patent and Trademark Office.

The terms "above", "top", "upper", "below", "bottom" and "lower" herein mean relative to silicon substrates 22, 50, 100, 180, 280, 342, and 380. That is, if a second element is "above" a first element, it means it is farther from substrates 22, 50, 100, 180, 280, 342, 380 and 430; and if it is "below" another element, then it is closer to substrates 22, 50, 100, 180, 280, 342 and 380 than the other element. The long dimension of substrates 22, 50, 100, 180, 280, 342 and 380 defines a plane that is considered to be a "horizontal" plane herein, and directions perpendicular to this plane are considered to be "vertical".

A metal oxide element typically comprises a relatively flat thin film of material. The terms "lateral" or "laterally" refer to the direction of the flat plane of the thin films 30, 70, 110, 216, 302, 356, and 396. In FIG. 1, the lateral direction would be the horizontal direction.

Figure 8:
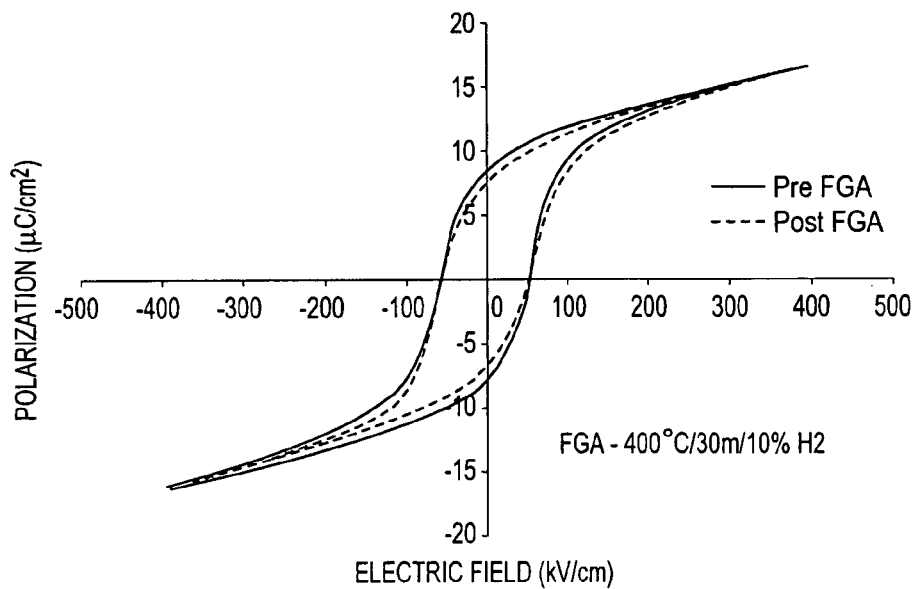
FIG. 8 is a hysteresis curve of a ferroelectric memory with strontium bismuth tantalate (SBT) ferroelectric that has a hydrogen barrier layer of strontium tantalate (STO) deposited on top of the substrate prior to the forming gas anneal process.

FIG. 8 is a hysteresis curve that is a graph of polarization in microcoulombs per square centimeters (μC/sqxcm), versus applied electric field in kilovolts per centimeter, of a ferroelectric capacitor with strontium bismuth tantalate (SBT) ferroelectric that had a hydrogen barrier layer of strontium tantalate (STO) deposited on top of the capacitor prior to the forming gas anneal process. The forming gas anneal was conducted at 400° C. for a time period of 30 minutes. The hydrogen concentration was 10%. A layer of STO was deposited on top of the SBT wafers prior to the forming gas anneal process. The pre-forming gas anneal hysteresis curve shows the hysteresis data for the sample before the forming gas anneal process. The post-forming gas anneal hysteresis curve shows hysteresis data for the sample after the forming gas anneal process. The remnant polarization 2 Pr is nearly identical for the two curves, showing that STO is very effective in preventing deterioration of the electrical properties of the ferroelectric capacitor while being subjected to the forming gas anneal.

Figure 9:
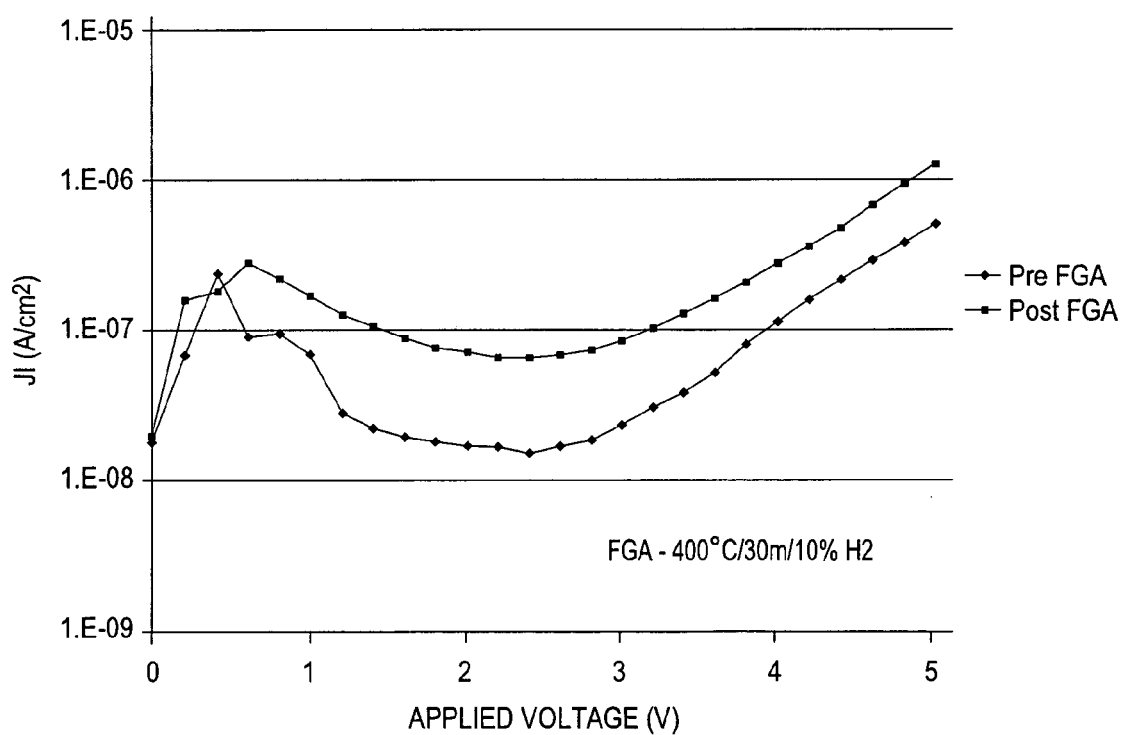
FIG. 9 is a graph depicting the leakage properties of a ferroelectric memory with SBT ferroelectric that has a hydrogen barrier layer of STO deposited on top of the substrate prior to the forming gas anneal process.

FIG. 9 is a graph of leakage current in joules (Jl), i.e., amperes per square centimeter (A/sqxcm), versus applied voltage in volts, depicting the leakage properties of a ferroelectric capacitor with SBT ferroelectric that had a hydrogen barrier layer of STO deposited on top of the capacitor prior to the forming gas anneal process. While there is some increase in the leakage current, the leakage current-still stays well under $10^{-6}$ amps per square cm, which generally is held as a measure of excellent leakage current properties for integrated circuit capacitors.

Figure 10:
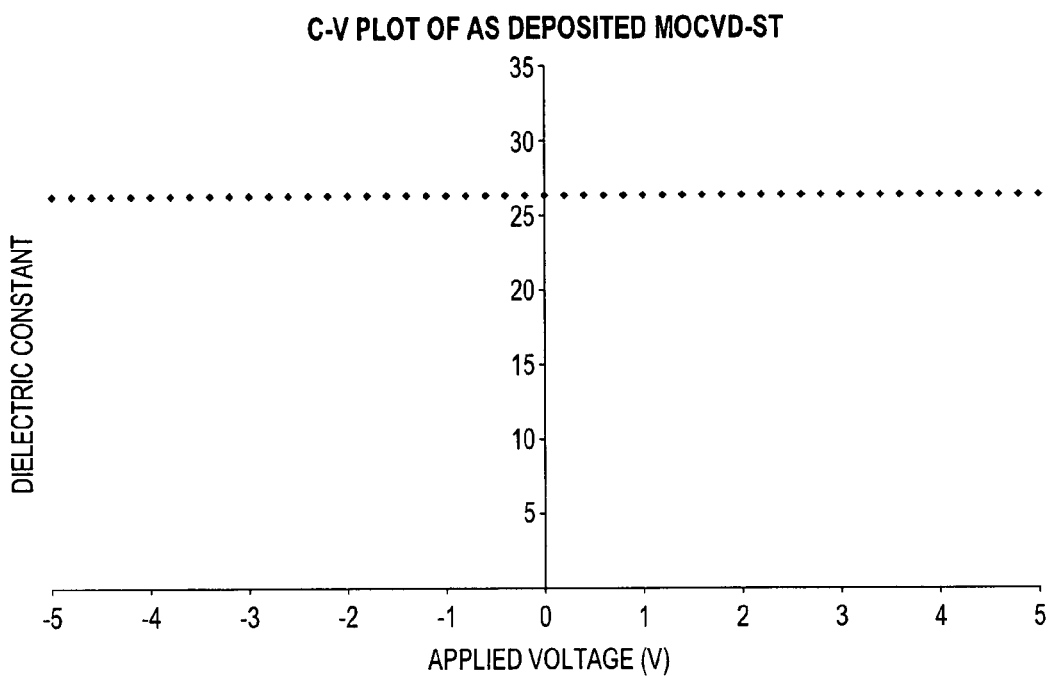
FIG. 10 is a C–V plot of an as deposited MOCVD-STO hydrogen barrier layer.
Figure 11:
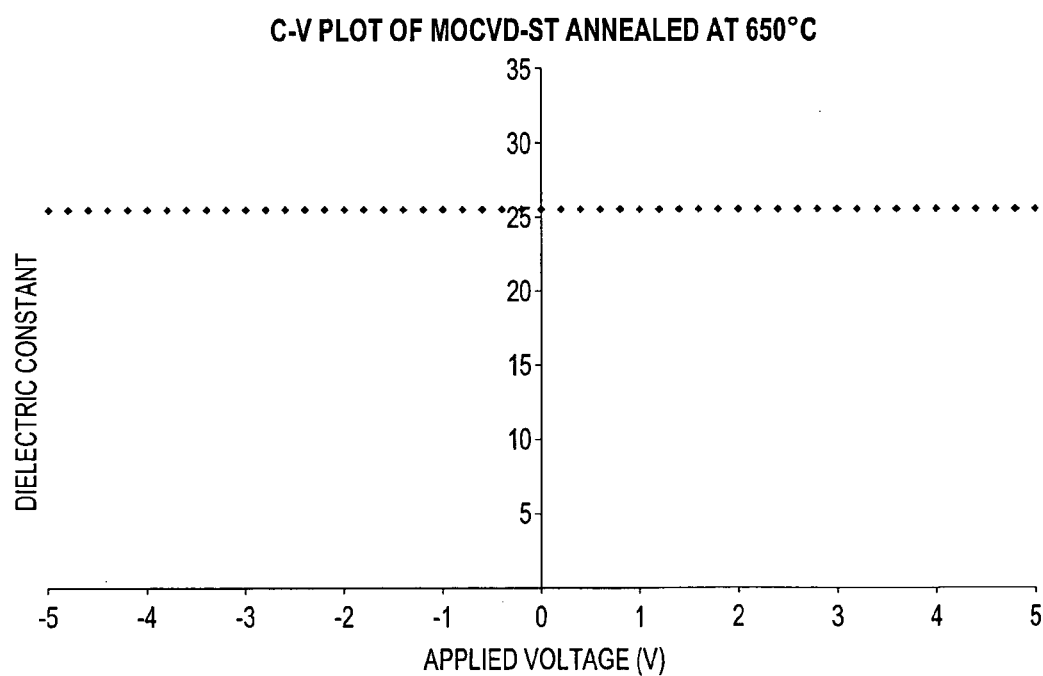
FIG. 11 is a C–V plot of a MOCVD-STO annealed at 650° C. in oxygen at ambient temperature for a time period of one hour.

FIG. 10 is a C–V plot, that is, a graph of dielectric constant versus applied voltage in volts, of an as deposited MOCVD-STO hydrogen barrier layer. FIG. 11 is a C–V plot of deposited and annealed MOCVD-STO hydrogen barrier layer that has been annealed at a temperature of 650° C. for a time period of one hour. The comparison of FIG. 10 and FIG. 11 shows that the dielectric constant of the layered superlattice material changes very little from the as deposited MOCVD-STO and the annealed MOCVD-STO. This bears the fact that the dielectric constant of the layered superlattice material in the ferroelectric capacitor changes very slightly when subjected to an annealing process. Moreover, the dielectric constant is essentially flat in both cases. This indicates that the STO material is amorphous even after the 650° C. anneal for one hour, and that there is no grain growth during the anneal. This is an important requirement for a hydrogen barrier layer, due to the fact that any recovery anneals performed for SBT in a process flow will not change the amorphous nature of the STO and, hence, barrier properties of STO are maintained. The flatness also indicates excellent electronic performance, since the specifications will not change for different applied voltages.

2. Detailed Description of the Fabrication Process

EXAMPLE 1

Figure 12:
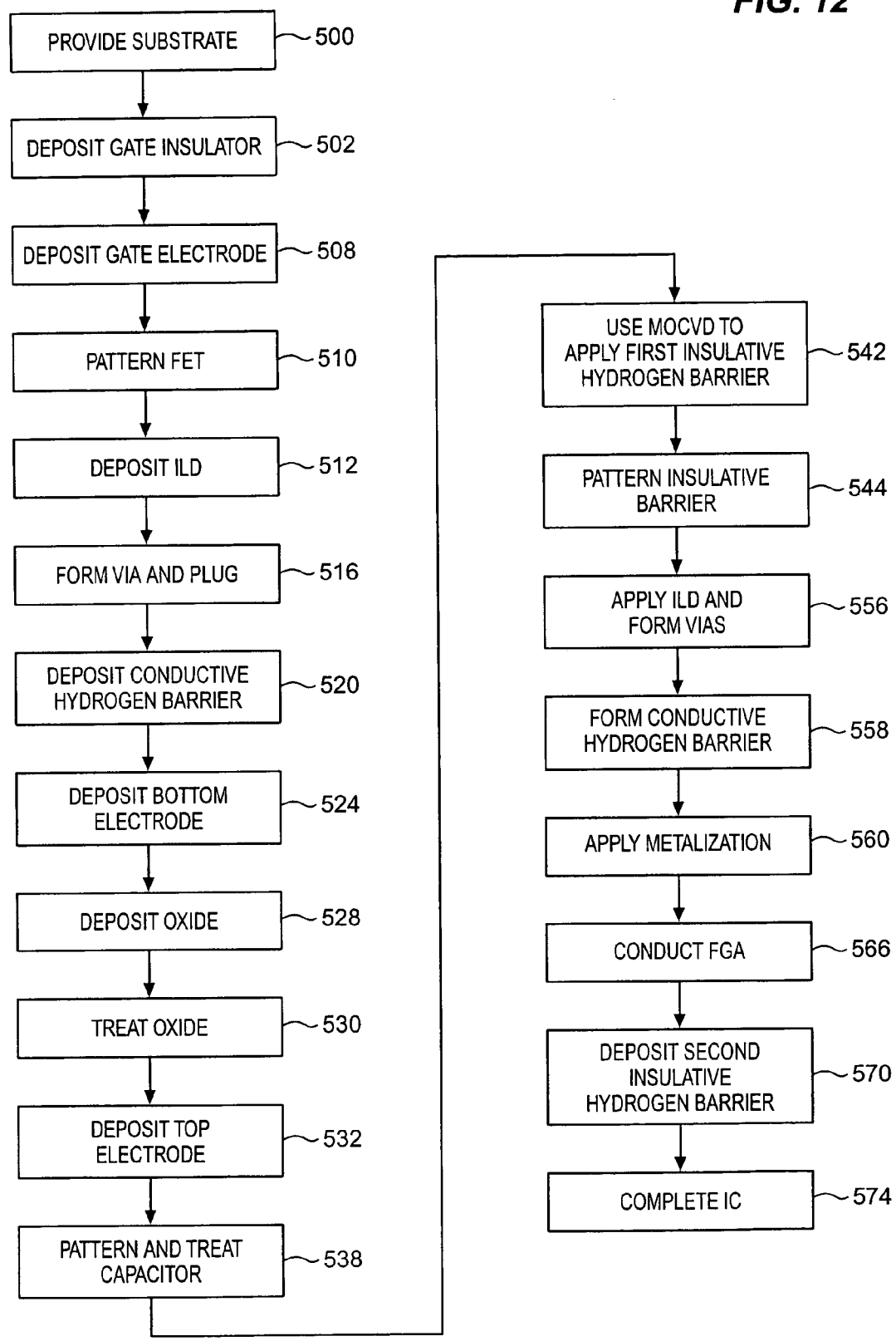
FIG. 12 is a flow chart showing a process flow sheet for fabricating an integrated circuit containing a hydrogen barrier layer in a preferred embodiment of the invention.

FIG. 12 is a flow chart showing an exemplary process flow sheet for fabricating an integrated circuit containing hydrogen barrier layers in a preferred embodiment of the invention. We shall discuss this embodiment in connection with FIG. 3; however, with modifications known in the art, it could also be discussed with respect to other figures. A substrate is provided at 500. The integrated circuit is preferably formed on a conventional wafer that may-be silicon, gallium arsenide or other semiconductor, or an insulator, such as glass or magnesium oxide (MgO). The substrate 100 is formed by conventional methods and preferably includes a field oxide 102 preferably grown to a thickness of 500 nm in a furnace. Preferably, the substrate also contains source region 112; drain region 124, and channel region 122. Source region 112 and drain region 124 are formed by a conventional doping method. At 502, gate insulator 116 is formed. This may be grown in a furnace in a separate processing step, or may be formed by oxidation of semiconductor 100 during the process of forming other elements such as gate electrode 118. At 508, gate electrode 118 is formed on top of gate insulator 116. At 510, gate insulator 116 and gate electrode 118 are patterned. At 512, an ILD 136 is formed over FET 114 and field oxide layer 102. At 514, via 126 is formed to the FET and a conductive plug 128 is formed in via 126. At 520, the conductive hydrogen barrier layer 120 is applied. Preferably, conducting hydrogen barrier layer 120 comprises a nitride of titanium, copper or tungsten or a nitride of aluminum and another chemical element selected from the group consisting of silicon, titanium, tantalum, niobium, copper, and tungsten. Preferably, hydrogen barrier layer 120 is deposited on the substrate by a sputtering process. Preferably, it has a thickness of about 150 nm. At 524, a first electrode layer 144 is applied to conductive barrier layer 120. Preferably, electrode layer 144 is made of platinum and is sputter-deposited to form a layer with a thickness of about 200 nm. An optional (not shown) titanium adhesion layer can be formed before electrode 144 is formed on the substrate. Metal oxide layer 110 is applied to bottom electrode layer 144 at 528. A metalorganic chemical vapor deposition process (MOCVD) method is the most preferred method to form the thin film metal oxide. The metal oxide also can be applied using a liquid deposition technique, such as a spin-coating or a misted deposition method as described in U.S. Pat. No. 5,456,945 issued Oct. 10, 1995 to McMillan et al. Usually, a final precursor solution is prepared from commercially available solutions containing the chemical precursor compounds. For example, the stoichiometric amounts of the various elements in a typical commercial solution for a layered superlattice thin film might be $Sr_{0.9}Bi_{2.18}Ta_2O_9$. It is often desirable, however, to add excess bismuth to this solution to generate extra oxides that will protect the ferroelectric compounds from hydrogen degradation during reducing conditions. At 530, metal oxide layer 110 is treated. Application step 528 is preferably followed by a treatment process 530 which preferably includes a drying step and crystallization substeps at elevated temperatures, such as an oxygen furnace anneal and a rapid thermal process (RTP) anneal; treatment process 530 may include treatment with ultraviolet radiation during or after application step 528. Steps 528 and 530 may be repeated as necessary to form a film of the desired thickness. For example, in a typical spin-on procedure, a coat of the precursor might be applied and dried. Then another precursor coat might be applied and dried. The dried film is then annealed in oxygen to form the resulting layered superlattice material 110 as part of process 530.

In step 532, second or top electrode 158 is applied to metal oxide layer 110. Preferably, top electrode layer 158 is made of platinum and is sputter-deposited to form a layer with a thickness of about 200 nm. In process 534, capacitor 156 is patterned and treated. This treatment can include additional furnace anneals. In process 542, insulating hydrogen barrier layer 160 is applied to the substrate. The preferred process includes the providing or preparation of a liquid precursor. Preferably, the insulating hydrogen barrier layer 160 precursor is a 0.05 molar strontium tantalate solution comprising a modified double alkoxide in toluene solvent. The modified double alkoxide is strontium tantalate penta ethoxide—2-methoxy ethoxide. The strontium tantalate precursor is preferably applied to the substrate by MOCVD. The deposition temperature is preferably between 400° C. and 500° C., and most preferably 450° C. In a typical deposition, the pressure in the deposition chamber is 3 mbars and the oxygen flow is between 600 ccm and 800 ccm. The carrier gas is an inert gas such as argon or nitrogen. Typically, the carrier gas is argon and the flow is between 200 ccm and 300 ccm. A typical liquid precursor flow is 0.2 ccm to 0.3 ccm. In the examples discussed in the figures, the film thickness was 60 nanometers to 80 nanometers (nm) thick. In process 544, insulation hydrogen barrier layer 160 is patterned. In process 556, ILD 138 is applied to the substrate and vias 148 and 140 are made in ILD 138. As is known in the art, this process also generally includes exposure of the substrate to hydrogen, and if so, it may be followed by a recovery anneal. However, usually this is not required because of barrier layer 160. In process 558, conducting hydrogen barrier layer 154 is formed, which may be a multistep process including several layers of different conductors. See, for example, U.S. patent application Ser. No. 09/197,385 filed 20 Nov. 1998 by Cuchiaro et al., which is incorporated herein by reference as though fully disclosed herein. Then, in process 560, the first metallization process is performed, as is known in the art. Typically, this is a multi-step process including several metals. In this process, a conductive plug 150 is formed in via 138 to contact conducting hydrogen barrier layer 154. At this time, a first forming gas anneal (FGA) may be performed in process 566 to repair defects and restore desired semiconductor properties in switch (MOSFET) 114. Typically, this process comprises hydrogen annealing at atmospheric pressure in a $H_2$—$N_2$ (forming gas) gas mixture with 1% to 5% $H_2$, at a temperature of between 200° C. and 400° C. for a time duration of from 10 minutes to 40 minutes. A second insulating hydrogen barrier layer 162 is optionally applied to the metal layer. The process is similar to that described in connection with process 542. The application temperature of this step is preferably 450° C. or less. In step 574, the integrated circuit is completed, which typically includes deposition of a passivation layer. These processes, generally referred to as "back end" processes, generally include further hydrogen annealing to repair defects and restore desired semiconductor properties in the integrated circuit. Typically, the hydrogen anneal (FGA) of the integrated circuit is conducted at atmospheric pressure in a $H_2$—$N_2$ (forming gas) gas mixture with 1% to 5% $H_2$, at a temperature of between 200° C. and 400° C. for a time duration of from 10 minutes to 40 minutes.

In the above examples, conducting hydrogen barrier layers 20 and 154 are used in combination with the insulating hydrogen barrier layer. The conducting hydrogen barrier layers are optional. They also may be multilayer elements, as known in the art. In Example 1, conducting barrier layer 154 is formed after insulating barrier layer 160. In the following example, an optional conducting hydrogen barrier layer 228 is used, but is formed before insulating hydrogen barrier layer 230.

EXAMPLE 2

Figure 13:
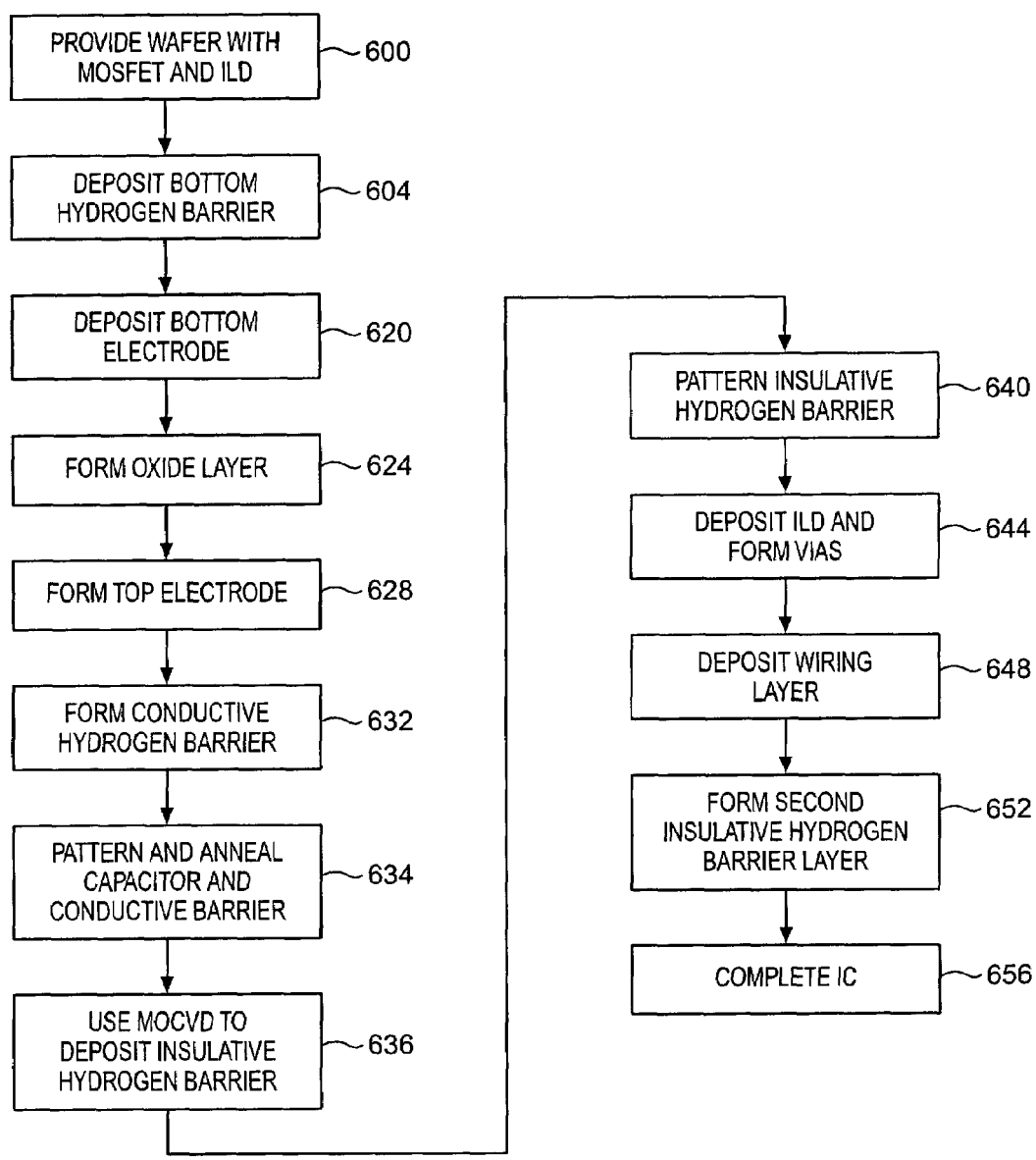
FIG. 13 is a flow chart showing a process flow sheet for fabricating an integrated circuit containing a hydrogen barrier layer in another preferred embodiment of the invention.

FIG. 13 is a flow chart showing a process flow sheet for fabricating an integrated circuit 244 containing hydrogen barrier layers in a preferred embodiment of the invention. This process is described in connection with the embodiment of FIG. 4; however, it also could be used in combination with other embodiments. Subprocess 600 provides substrate 184 which comprises an incomplete integrated circuit wafer in which a MOSFET 190 and ILD 186 have been formed. The substrate includes a conventional semiconductor substrate 180 that may be silicon, gallium arsenide or other semiconductor, or an insulator, such as glass or magnesium oxide (MgO). Wafer 184 is formed by conventional methods and preferably includes a furnace grown field oxide 210, preferably having a thickness of 500 nm. Preferably, wafer 184 also contains source region 208; drain region 188, channel region 192, gate insulator 200, gate electrode 196, and ILD 186, all formed by conventional methods. In process 604, a bottom hydrogen barrier layer 204 is formed. This barrier layer may be a conducting hydrogen barrier layer formed by conventional methods, or may be an insulating hydrogen barrier layer formed by a process as described above. In process 620, a first electrode layer 234 is applied to hydrogen barrier layer 204. Preferably, first electrode layer 234 is made of platinum and is sputter-deposited to form a layer with a thickness of about 200 nm. An optional (not shown) titanium adhesion layer can be formed before first electrode 234 is formed.

In step 622, metal oxide 216 is formed, which preferably is a material as described above and is applied and treated as described above. In step 628, the second or top electrode 218 is applied to metal oxide 216. Preferably, top electrode layer 218 is made of platinum and is sputter-deposited to form a layer with a thickness of about 200 nm. In process 632, a conducting hydrogen barrier layer 228 is formed by conventional processes, which may include a multistep process including several layers of different conductors. See, for example, U.S. patent application Ser. No. 09/197,385 mentioned above. In process 634, the bottom hydrogen barrier layer 204, bottom electrode 234, metal oxide. 216, top electrode 218 and conducting barrier layer 228 are patterned by conventional means and preferably annealed. The patterning and annealing may take place in many different ways as is known in the art.

In process 636, insulating hydrogen barrier layer 230 is formed as described above. In step 640, insulation hydrogen barrier layer 230 is patterned. In process 644, an ILD 246 is formed over MFM capacitor 226, ILD 186 and vias 194, 232, and 224 and are formed in a conventional manner. In process 648, metallization is performed forming conductive plugs 242, 238, and 220 in vias 194, 232, and 224, respectively. A forming gas step may be performed at this point and/or later in the process as known in the art. In step 652, an optional second insulating hydrogen barrier layer 248 is deposited on top of the metal layer in a manner as described above. In step 656, the integrated circuit is completed, including the formation of a capping layer 212. Other details of the completion step are discussed above.

EXAMPLE 3

Figure 14:
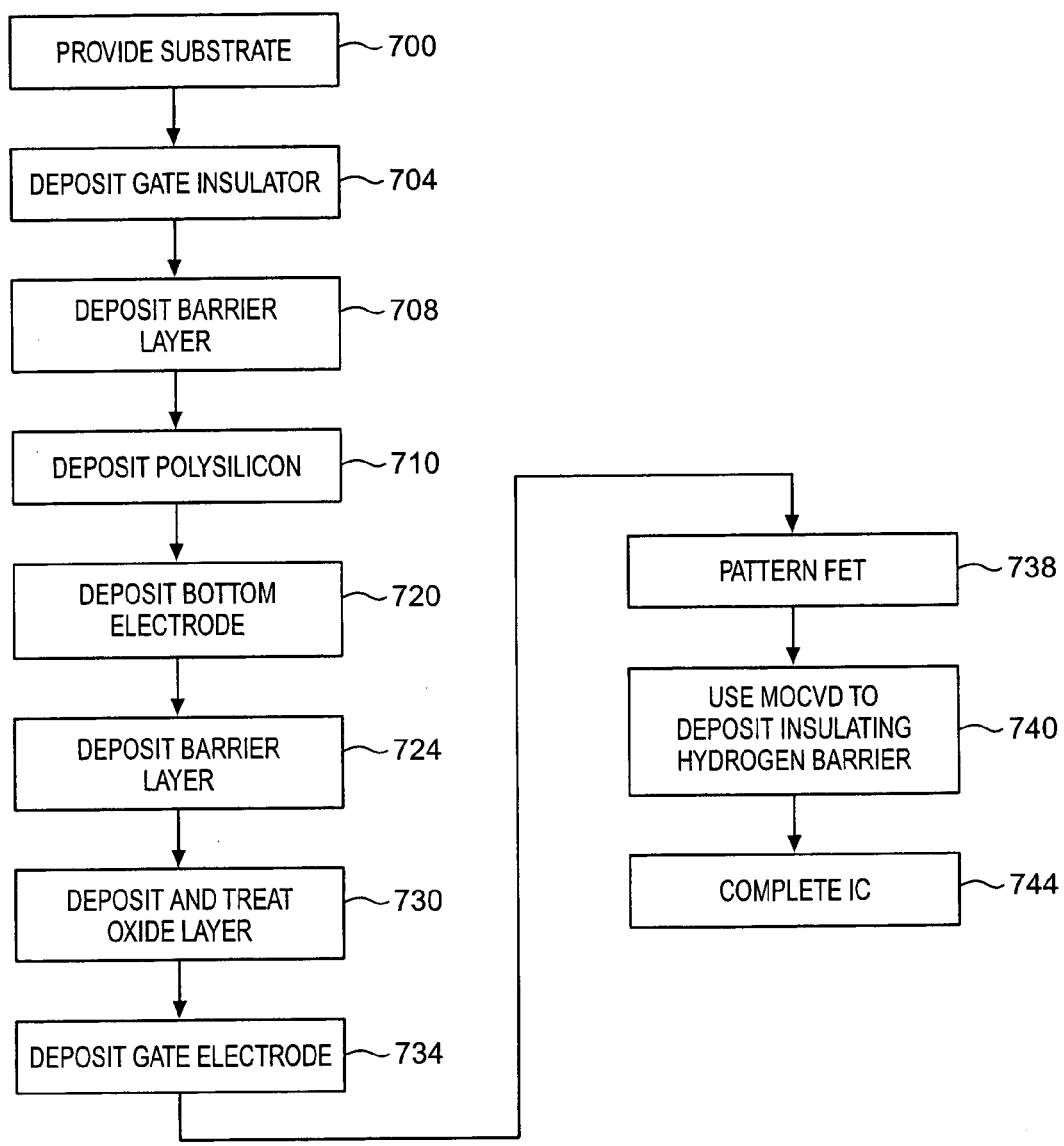
FIG. 14 is a flow chart showing a process flow sheet for fabricating an integrated circuit containing a hydrogen barrier layer in a further preferred embodiment of the invention.

FIG. 14 is a flow chart showing a process flow sheet for fabricating an integrated circuit containing an insulation hydrogen barrier layer in another preferred embodiment of the invention. This process describes the formation of a FET in combination with which the hydrogen barrier layer is used, and is described in connection with FIGS. 6 and 7. In step 700, a substrate 342, 380 is provided having sources, drains, and channels as described above. In process 704, a gate insulator 350, 388 is formed, either separately or by oxidizing substrate 342, 280 as part of the process of forming other elements as described above. In step 708, an optional barrier layer 352 is formed. This may be either conducting or insulating. If insulating, it is made very thin and preferably of a relatively low dielectric constant material so that the capacitance is such that the voltage drop across it is relatively small. A polysilicon layer 390 may then be formed by a conventional process, generally known as "first poly" in the art. Then a floating gate 354, 392 may be formed, preferably of about 200 nm of platinum, and optionally including an adhesion layer. In step 724, a hydrogen barrier layer 394 may be formed, which again may be either conductive or insulating, and which is formed by methods described above. In process 730, the metal oxide layer 356, 396 is deposited by methods as described above. In step 734, the second or gate electrode 360, 398 is applied to the metal oxide 360, 398. Preferably, gate electrode 360, 398 is made of platinum and is sputter-deposited to form a layer with a thickness of about 200 nm. The FET 340, 400 is patterned in step 738 by conventional processes, which typically include treating it with a furnace anneal and RTP step, or both. It is noted that the patterning can be done in several steps, such as patterning the linear capacitor 364, 410 earlier in the total process and patterning the metal oxide capacitor 362, 408 later in the total process. In step 736, an insulation hydrogen barrier layer 363, 406 is formed by a process as described above. In the case of the FET of FIG. 6, a conducting barrier layer 358 is also formed, either before or after formation of the insulation hydrogen barrier layer 362. In process 744, the integrated circuit is completed, which includes a forming gas anneal in hydrogen as described above.

Exemplary capacitors as described above have been made using strontium tantalate (STO), bismuth tantalate (BT), and tantalum penta-oxide (TO). The results for STO were discussed above, and those for the BT and TO were similar, though the polarizability of ferroelectric was not quite as high after complete processing. Titanium oxide, aluminum oxide, and zirconium oxide have also showed promising results. At the present time, the results indicate that STO outperforms any of the materials, and far outperforms all prior art hydrogen barrier layers.

It is a feature of the invention that the material out of which the hydrogen barrier layer is made is amorphous, that is, not crystallized. X-ray diffraction (XRD) and SEM surface analysis has been performed on the material and it has been found to be very dense. It is believed that this amorphous dense nature is what results in such favorable hydrogen barrier layer properties. Further, such amorphous dense films can be obtained at low deposition temperatures in the range of 450° C. quite easily with a deposition technique such as MOCVD. The low deposition temperature permits the deposition process to be used with other conventional integrated circuit processes and materials, such as wiring layers, that are damaged at temperatures higher than about 450° C.

An advantage of the STO is that it remains dense even after annealing at 650° C. for one hour, and there is no grain growth during this anneal, as evident from the XRD and SEM data. This is an important requirement for a hydrogen barrier layer used in combination with metal oxides, such as layered superlattice materials, since the recovery anneals used in the art for the layered superlattice materials often take place at about 650° C.

The use of MOCVD as the preferred deposition process is also a feature of the invention. This process provides the most dense films. Other processes, such as spin-on and liquid source misted deposition, have less reproducible results, particularly when the resulting coatings are annealed at low temperatures.

There have been described novel materials and processes for fabricating hydrogen barrier layers. While the invention has been described in terms of specific embodiments and materials, it should be understood that the particular embodiments shown in the drawings and described within this specification are for purposes of example and should not be construed to limit the invention which will be described in the claims below. Further, it is evident that those skilled in the art may now make numerous uses and modifications of the specific, embodiments described, without departing from the inventive concepts. For example, now that the advantage of utilizing amorphous STO as a hydrogen barrier layer has been disclosed, other amorphous materials and/or other variations of STO may be used, and undoubtedly will be used by those skilled in the art. It is also evident that equivalent structures and processes may be substituted for the various structures and processes described. Consequently, the invention is to be construed as embracing each and every novel feature and novel combination of features present in and/or possessed by the integrated circuits described.

We claim:

1. An integrated circuit comprising:
   a thin film of metal oxide material; and
   a hydrogen barrier layer located to inhibit the diffusion of hydrogen to said metal oxide material, said hydrogen barrier layer comprising a primary hydrogen barrier layer material and a supplemental barrier layer material, said primary hydrogen barrier layer material being an amorphous material and said supplemental hydrogen barrier layer material being a crystalline material, and wherein said primary and supplemental materials are either both conducting or both insulating.

2. An integrated circuit as in claim 1 wherein said supplemental material is located contact with said primary material.

3. An integrated circuit as in claim 1 wherein said primary material and said supplemental material are both conducting.

4. An integrated circuit as in claim 1 wherein said primary material and said supplemental material are both insulating.

5. An integrated circuit as in claim 1 wherein said primary material is more compatible said metal oxide material and is located closer to said metal oxide material.

6. An integrated circuit as in claim 5 wherein said primary material comprises one of chemical elements that is in said metal oxide material.

7. An integrated circuit as in claim 6 wherein said metal oxide material is a layered superlattice material.

8. An integrated circuit as in claim 7 wherein said primary material comprises material selected from the group consisting of: strontium tantalate, bismuth tantalate, tantalum oxide, uranium oxide, zirconium oxide and aluminum oxide.

9. An integrated circuit as in claim 1 wherein said supplemental material comprises a material selected from the group consisting of silicon nitride and alumina.

* * * * *